(12) United States Patent
Meyer et al.

(10) Patent No.: US 9,175,214 B2
(45) Date of Patent: Nov. 3, 2015

(54) LIGHTING DEVICE WITH LIGHT SOURCE AND WAVELENGTH CONVERTING ELEMENT

(75) Inventors: Joerg Meyer, Aachen (DE); Volker Weiler, Aachen (DE); Peter Josef Schmidt, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 365 days.

(21) Appl. No.: 13/509,802

(22) PCT Filed: Dec. 17, 2010

(86) PCT No.: PCT/IB2010/055905
§ 371 (c)(1),
(2), (4) Date: May 15, 2012

(87) PCT Pub. No.: WO2011/073951
PCT Pub. Date: Jun. 23, 2011

(65) Prior Publication Data
US 2012/0261704 A1    Oct. 18, 2012

(30) Foreign Application Priority Data

Dec. 17, 2009  (EP) ..................................... 09179553
Oct. 8, 2010    (EP) ..................................... 10186925

(51) Int. Cl.
*H01L 33/00*     (2010.01)
*C09K 11/61*    (2006.01)
*C09K 11/02*    (2006.01)
*C09K 11/64*    (2006.01)
*H01L 33/50*    (2010.01)

(52) U.S. Cl.
CPC .............. *C09K 11/617* (2013.01); *C09K 11/02* (2013.01); *C09K 11/645* (2013.01); *H01L 33/502* (2013.01); *H01L 2224/48247* (2013.01); *H01L 2933/0041* (2013.01)

(58) Field of Classification Search
USPC ..................................... 257/13, 79–103, 918, 257/E51.018–E51.022, E33.001–E33.077, 257/E33.054, E25.028, E25.032
See application file for complete search history.

(56) References Cited

U.S. PATENT DOCUMENTS

| | | |
|---|---|---|
| 2003/0230977 A1 | 12/2003 | Epstein |
| 2005/0236984 A1 | 10/2005 | Aoyama |
| 2006/0169998 A1 | 8/2006 | Radkov |
| 2007/0273282 A1 | 11/2007 | Radkov |
| 2008/0296596 A1 | 12/2008 | Setlur |

(Continued)

FOREIGN PATENT DOCUMENTS

| | | |
|---|---|---|
| JP | 2008527888 A | 7/2008 |
| JP | 2008280471 A | 11/2008 |

(Continued)

*Primary Examiner* — Mamadou Diallo
(74) *Attorney, Agent, or Firm* — Yuliya Mathis

(57) ABSTRACT

The invention relates to a lighting (1) device comprising a light source (2) and a wavelength converting element (7), which comprises a phosphor compounded with a polymer. The phosphor contains a metal-ion activator which is excitable via a partially forbidden electronic transition. The phosphor and the polymer being chosen such that the difference in their refractive index is smaller than 0.1. Due to this choice, scattering in the wavelength converting element (7) remains at minimum. Interesting wavelength converting elements (7) are obtained when using phosphors comprising specific Mn(IV)-activated fluoride compounds and specific fluorine-containing polymers.

13 Claims, 1 Drawing Sheet

(56) References Cited

U.S. PATENT DOCUMENTS

2010/0096974 A1 4/2010 Setlur
2010/0142189 A1 6/2010 Hong
2010/0181582 A1* 7/2010 Li et al. .......................... 257/91
2010/0187976 A1 7/2010 Winkler

FOREIGN PATENT DOCUMENTS

| | | |
|---|---|---|
| JP | 2009070892 A | 4/2009 |
| WO | 2007100824 A2 | 9/2008 |
| WO | 2009101578 A1 | 8/2009 |

* cited by examiner

LIGHTING DEVICE WITH LIGHT SOURCE AND WAVELENGTH CONVERTING ELEMENT

FIELD OF THE INVENTION

The invention relates to a lighting device comprising a light source arranged to emit light with a primary wavelength, and a wavelength converting element arranged to convert at least part of the light with the primary wavelength into light with a secondary wavelength, the element comprising a phosphor with a metal-ion activator which is excitable via a partially forbidden electronic transition, said phosphor being compounded with a polymer. The invention also relates to a wavelength converting element suitable for use in such lighting device as well as to a method for the manufacture of a wavelength converting element.

BACKGROUND OF THE INVENTION

A lighting device of the type mentioned in the opening paragraph is known from the patent publication U.S. 2010/0096974-A1. This document describes a device comprising a LED having an encapsulant, which acts as a wavelength converting element. Said encapsulant is formed as a shell of a suitable plastic or glass, in which a phosphor or a phosphor blend in particle form is dispersed. Said phosphor (blend) acts as a luminescent material that absorbs radiation energy in a portion of the electromagnetic spectrum and emits radiation energy in another portion of the electromagnetic spectrum. In this manner, (part of) the light with a primary wavelength emitted by the LED is converted into light with another (secondary) wavelength.

The inventors have found that phosphors with metal-ion activators which are to be excited via a partially forbidden absorption band show limited interaction with light of an appropriate wavelength. Such forbidden absorption bands are especially found in phosphors having a transition metal-ion activator in the host lattice. In these metals, specific d-d electronic transitions are forbidden. Such phosphors show relatively low absorbance upon interaction with light having a suitable wavelength. Nevertheless sufficient light conversion of the primary wavelength can be achieved when using relatively long interaction paths of the light with the primary wavelength through the converting element. In practice this solution implies rather thick elements. However, such long interaction paths usually gives rise to undesired large scattering losses.

SUMMARY OF THE INVENTION

It is an object of the invention to mitigate or at least diminish the above-mentioned problem and/or other problems. The invention particularly aims at providing a cheap lighting device having a light source and an efficient wavelength converting element with phosphors with a metal-ion activator which is excitable via a partially forbidden absorption. Especially the scattering losses in the converting element should be relatively low. Another object of the invention is providing an efficient wavelength converting element of the indicated type suitable for use in a lighting device as well as the manufacture of such wavelength converting element.

These and/or other objects are achieved by means of a lighting device comprising 1) a light source arranged to emit light with a primary wavelength, and 2) a wavelength converting element arranged to convert at least part of the light with the primary wavelength into light with a secondary wavelength, the element comprising a phosphor with a metal-ion activator which is excitable via a partially forbidden electronic transition, said phosphor being compounded with a polymer, the phosphor and the polymer being chosen such that the difference in their refractive index is smaller than 0.1.

The invention is based on the insight gained by the inventors that the undesired scattering in converting elements can be significantly reduced by compounding the phosphor in a polymer having a refractive index which is closely matched to the one of the phosphor. In practice a significant reduction of scattering is already obtained if the refractive index difference is smaller than 0.1. Preferably the difference in the refractive index of the phosphor and the refractive index of the polymer is smaller than 0.05, whereas a difference smaller than 0.03 is more preferred. The best lighting devices of the desired type are those in which the refractive index difference is smaller than 0.02. It generally holds that a smaller refractive index difference means lower scattering losses in the wavelength converting element.

In experiments leading to the present invention, the inventors have furthermore realized that the use of single crystals or fully dense ceramics of the indicated phosphors is very promising, especially when they have a cubic—and thus isotropic—structure. Such materials are highly transparent and therefore show low or no scattering. However, processing of single crystals as well as of fully dense ceramics appears to be too costly or simply not feasible due to temperature constraints.

In principle, the invention will function in all kind of lighting devices having a light source emitting light with a primary wavelength and a phosphor for (partly) converting the wavelength of this light, such as for example TL-tubes. However, practice has shown that the invention can be applied with most advantage in lighting devices comprising one or more LEDs as a light source.

The wavelength converting element in the invented lighting device can comprise a single phosphor, but also multiple phosphors. If two or more phosphors are used, at least one of them should have a metal-ion activator which is excitable via a partially forbidden transition. Multiple phosphors are especially useful when designing lighting devices which should emit white light.

In an embodiment of a lighting device according to the present invention, the phosphor comprises a Mn(IV)-activated fluoride compound. In phosphors of this type—which are usually crystalline—the Mn(IV) transition metal-ion is located in a specific coordination site in the crystalline host lattice. Here it functions as an activator, which has to be excited via a partially forbidden d-d transition. Most generally, phosphors having a fluoride-based host lattices show relatively small refractive indexes. In combination with a well-chosen polymer material, a good match of the refractive indexes can be obtained, so that the refractive index difference is rather small, i.e. smaller than 0.1. Mn(IV)-activated fluoride compound are preferred over other known phosphor compounds, like Cr(III)- or Eu(III)-activated crystalline phosphor compounds, as the Mn(IV) compounds show an interesting emission line pattern in the red area of the electromagnetic spectrum and moreover have a relatively good excitability in the blue area of the spectrum.

In another embodiment of the lighting device according to the invention, the Mn(IV)-activated fluoride compound comprises at least one of $K_2SiF_6$:Mn(IV) and $Na_3Li_3Al_2F_{12}$:Mn (IV). A person skilled in the art knows that small amounts of the chemical elements in these crystalline compounds can be replaced by other elements. This is due either to impurities in the starting materials or to a deliberate choice in order to adjust the properties of these compounds. Compounds of these types are interesting as, in combination with other phosphor compounds, relatively cheap lighting devices can be manufactured having a warm white spectrum at correlated color temperatures <3000K with high color rendition ($R_{a8}$>80 and positive $R_9$). The other phosphor compounds should emit in the yellow to green part of the electromagnetic spectrum. $Y_3Al_5O_{12}$:Ce or $Lu_3Al_5O_{12}$:Ce (or known variations thereof) are good candidates for such other phosphor compounds.

In still another embodiment of the invented lighting device, the polymer is a fluorine-containing polymer. Polymers of this type can be used with great advantage when compounded with phosphors having a metal-ion activator which is excitable via a partially forbidden electronic transition. Especially phosphors comprising a Mn(IV)-activated fluoride compound, such as compounds of the type $K_2SiF_6$:Mn(IV) and $Na_3Li_3Al_2F_{12}$:Mn(IV), can be applied with great advantage in wavelength converting elements of lighting devices. The refractive index of these phosphors and polymers match rather well. Wavelength converting elements comprising a phosphor as described before, being compounded with an organic polymer as described before appear to be quite transparent and therefore show unexpected low scattering.

In a further embodiment of the invented lighting device, the polymer is a co-polymer comprising at least two of tetrafluoroethylene, hexafluoropropylene and vinylidene fluoride. With the use of the right combination of two flouropolymers as indicated, the refractive index of the resulting co-polymer can be nicely adjusted to a desired value, especially to the value of the refractive index of the phosphor compound to be mixed with the polymer. Even more preferred in this respect is the lighting device according to the invention in which the polymer is a co-polymer of tetrafluoroethylene, hexafluoropropylene and vinylidene fluoride. A skilled person can without any inventive action select the right amounts of these three fluoropolymer precursors in order to design a co-polymer with a desired refractive index.

In a still further embodiment of the lighting device according to the present invention, the amount of phosphor in the polymer ranges from 10-20 vol. %. Experiments have shown that a phosphor amount smaller than 10 vol. % causes that the conversion elements should be designed rather thick (>2 mm) in order to obtain a sufficient conversion efficiency. Phosphor amounts in the polymer larger than 20 vol. % results in converting elements having a thickness lower than 0.1 mm, which elements are difficult to handle in practice. Optimal amounts of the phosphor in the polymer range from 13-17 vol. %. Using these amounts, converting elements can be manufactured having an optimal combination of thickness and absorption efficiency.

An interesting embodiment of the invented lighting device shows the feature that it comprises at least two light sources and that the wavelength converting element is arranged remotely from the light sources. A lighting device according to this embodiment may comprise more than one wavelength converting element. In general, the present invention can be applied in lighting devices of which the wavelength converting element is proximate to the light source, usually a LED. In such devices, the wavelength converting element is in direct contact with the LED and may be shaped to form an optical lens. The invention can however also be applied in lighting devices in which the wavelength converting element is in the vicinity of the light source (LED). In such devices, the converting element can be present as a layer on the exterior of an optical lens, which lens is in direct contact with the LED. The present invention can however also be applied with great advantage in a lighting device having multiple LEDs wherein the converting element is arranged remotely from these LEDs. In this situation, the converting element preferably has the shape of a plate and is positioned at a distance from the light sources.

The invention relates also to a wavelength converting element, which is suitable for use in a lighting device. More particularly, such element according to the invention comprises a phosphor with a metal-ion activator which is excitable via a partially forbidden electronic transition, said phosphor being compounded with a polymer, the phosphor and the polymer being chosen such that the difference in their refractive index is smaller than 0.1. Said phosphor comprises preferably a Mn(IV)-activated fluoride compound, more preferably a compound comprising at least one of $K_2SiF_6$:Mn(IV) and $Na_3Li_3Al_2F_{12}$:Mn(IV). The phosphor may also comprise a coating to increase the stability of the phosphor. Preferably the coating material consists substantially of a fluoride with very low solubility in water, such as calcium fluoride. Said polymer can be an inorganic polymer, but an organic polymer is preferred. Fluorine-containing polymers appear to be very useful, especially co-polymers comprising at least two of tetrafluoroethylene, hexafluoropropylene and vinylidene fluoride. The wavelength converting element can be shaped as an optical element, particularly as a lens or as a plate.

The invention further relates to a method for manufacturing a wavelength converting element. This invented method has the feature that the phosphor is compounded with the polymer, after which the compound is shaped into a wavelength converting element. Contrary to state of the art methods, the phosphor and (pre)polymer are after their mixing not cured 'in situ'. According to the invention, the mixture of phosphor and the already cured polymer is preferably prepared by extrusion or kneading. The shaping of the converting element is preferably performed by means of hot pressing or injection moulding. The elements manufactured according to this method can be applied with great advantage in a lighting device.

BRIEF DESCRIPTION OF THE DRAWINGS

These and other aspects of the invention will be apparent from and elucidated with reference to the embodiments described hereinafter.

In the drawings.

It is stressed that the drawing is schematic and not to scale. In the different Figures, same elements are denoted with same reference numbers.

DETAILED DESCRIPTION OF EMBODIMENTS

Figure 1:
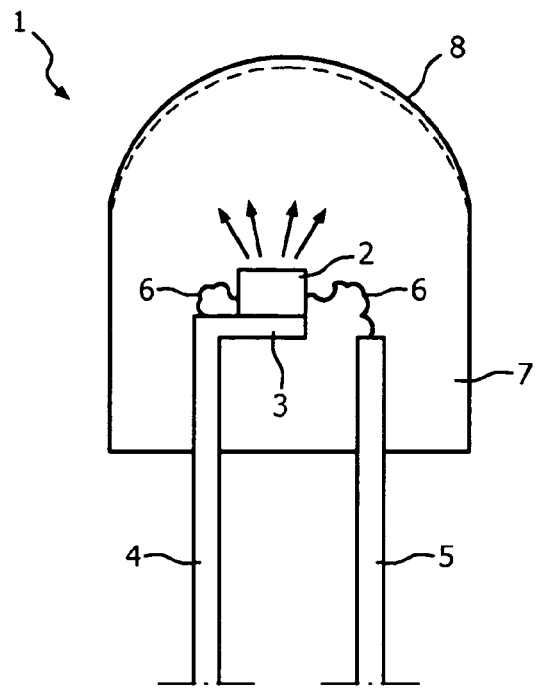
FIG. 1 shows a cross-section of a first embodiment of a lighting device according to the present invention.

FIG. 1 illustrates in cross-section a first embodiment of the lighting device 1 according to the present invention. Said lighting device 1 comprises a light source 2, which is embodied as a light emitting diode (LED). Although different types of LED can be used, it is preferred to apply a LED which is able to emit light having a wavelength of 500 nm or less. In the present device a LED of the GaInN type is used, which is able to emit light having a wavelength maximum of 450 nm. Said light source 2 is positioned on a part 3 of a power lead 4, which, together with a further power lead 5, arranges for electrical current that causes the LED to emit radiation. This radiation is indicated by the arrows that point away from the LED. The power leads 4, 5 include thin conducting wires 6 which are directly connected to the LED.

Light source 2 is encapsulated in a wavelength converting element 7, which has the shape of an optical lens. Converting element 7 is mainly composed of an organic polymer. A phosphor has been compounded with this polymer. Said phosphor contains a metal-ion activator which is excitable via a partially forbidden electronic transition. In the present situation a Mn(IV)-activated fluoride compound was used as the phosphor, more particularly the compound $Na_3Li_3Al_2F_{12}$:Mn(IV). A fluorine-containing polymer was used as a matrix for the phosphor. In more detail, the polymer used was a co-polymer of tetrafluoroethylene, hexafluoropropylene and vinylidene fluoride (Dyneon™ 221 GZ).

Due to a specific choice of both the phosphor and the polymer, the difference in the refractive index of both constituents of the converting element was below 0.03. More precisely, the refractive index of the phosphor material has been measured to be 1.340 whereas the refractive index of the polymer material was matched to a value of 1.363. Due to the small difference in refractive indexes of both constituents (0.023), hardly or no scattering was observed in the converting element, even when the element had rather large dimensions of 10 mm (length) by 5 mm (cross section). So, an efficient absorption of the blue radiation of 450 nm was possible, which was converted by the wavelength converting element to radiation with a wavelength maximum of 650 nm.

In the described first embodiment of the lighting device 1 according to the invention, the wavelength converting element is positioned proximate to the light source 2 (here the LED). Actually, light source 2 is directly surrounded by the phosphor material. As an alternative it is also possible to prepare a converting element 7 shaped as an optical lens in which the phosphor is not proximate to but in the vicinity of the light source 2. In that situation, the phosphor is concentrated in a layer 8 at some distance from the light source 1. In this embodiment, layer 8 functions as the wavelength converting element. In this alternative embodiment of the invented lighting device, the other part of the lens (outside layer 8) is substantially free of the phosphor. The complete lens may consist of the polymer material which matches with the phosphor. It is also possible that the part of the lens which is substantially free of the phosphor is composed of another polymer material, without departing from the present invention. Layer 8 should however contain a polymer having a refractive index as defined according to the present invention.

In a further alternative of the first embodiment, the wavelength converting element 7 may comprise additional phosphors, which preferably should emit in the yellow to green part of the electromagnetic spectrum. $Y_3Al_5O_{12}$:Ce(III) or $Lu_3Al_5O_{12}$:Ce(III) (or known variations thereof) are good candidates for such additional phosphor compounds. Wavelength converting element with phosphor mixtures of these types are interesting as relatively cheap lighting devices with a warm white spectrum at correlated color temperatures <3000K with high color rendition ($R_{a8}$>80 and positive $R_9$) can be manufactured with such mixtures.

Figure 2:
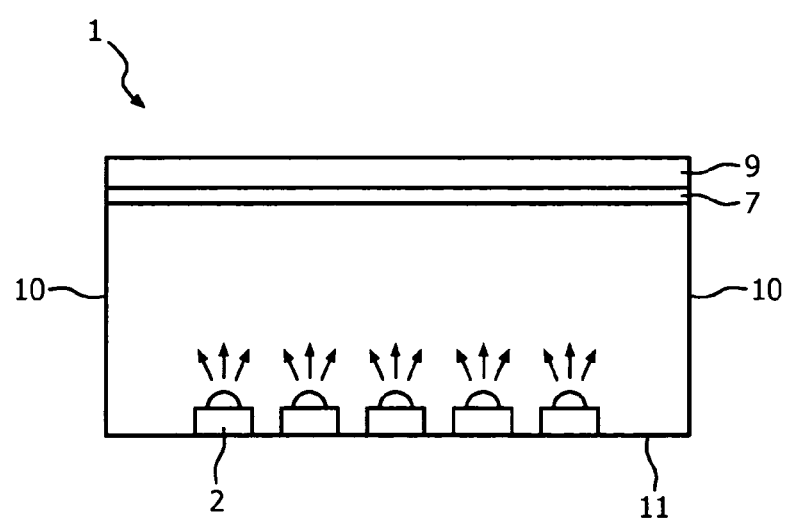
FIG. 2 shows a cross-section of a second embodiment of a lighting device according to the present invention.

FIG. 2 illustrates in cross-section a second embodiment of the lighting device 1 according to the present invention. Device 1 comprises a plurality of light sources 2 (again embodied as LEDs), of which only five are shown in cross-section. These LEDs may emit radiation of the same or of different wavelength. The direction of the radiation is indicated by small arrows. Upon activation of the light sources 2 via power leads and/or connection wires (not shown), the emitted light leaves the lighting device 1 via converting element 7, which is here formed as a plate. During passage of the plate-shaped converting element 7, (part of) the incident radiation is converted to radiation having a different wavelength. In the present device, said optical plate is attached to a substrate 9 which is transparent to the (converted) radiation. The side-walls 10 and the bottom-wall 11 are provided with reflecting means, so that a large portion of the generated radiation leaves the lighting device 1 via the wavelength converting element 7. If LEDs are used which emit radiation with different wavelengths, color mixing can occur within the lighting device 1. In such device, it may be useful to apply a stack of wavelength converting elements 7, the individual elements being chosen for the different wavelengths emitted by the different LEDs.

The wavelength converting element 7 comprises a polymer and a phosphor with a metal-ion activator which is excitable via a partially forbidden electronic transition. More precisely, the phosphor comprises a Mn(IV)-activated fluoride compound, more specifically the compound $K_2SiF_6$:Mn(IV). The polymer is a fluorine-containing polymer chosen from the class of organic polymers. More precisely, the polymer is a co-polymer comprising at least two of tetrafluoroethylene, hexafluoropropylene and vinylidene fluoride (Dyneon™ THV 2030 GZ). The mentioned phosphor has been compounded with the indicated polymer, starting with appr. 15 vol % phosphor in the co-polymer. The phosphor and polymer materials have been chosen such that the difference in their refractive index is smaller than 0.1. More precisely, the refractive index of the phosphor material has been determined to be 1.340 whereas the refractive index of the polymer material was matched to a value of 1.350. Due to the small difference is refractive indexes of both constituents (0.010), hardly or no scattering was observed in the converting element, even when the plate-shaped element was rather thick (appr. 2 mm).

The wavelength converting element according to the present invention was manufactured and shaped according to the invented method. First, a good combination of phosphor and polymer was determined. This means especially that the difference in refractive index between both substances should be small (smaller than 0.1, preferably smaller than 0.05 and more preferably smaller than 0.02). Subsequently a certain volume amount of phosphor material and polymer material were combined and extruded or kneaded at a temperature below 200° C. Above this temperature, decomposition of the phosphor material is possible. The amount of phosphor in the polymer ranged between 10 and 20 vol %. After mixing both constituents, the wavelength converting element was shaped as an optical lens or as an optical plate by means of hot pressing or injection moulding. The dimensions of the element depended on their application.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A lighting device comprising:
   a light source arranged to emit light with a primary wavelength, and
   a wavelength converting element arranged to convert at least part of the light with the primary wavelength into light with a secondary wavelength, the element comprising a phosphor with a metal-ion activator which is excitable via a partially forbidden electronic transition, said phosphor being compounded with a polymer, the phosphor and the polymer being chosen such that the difference in their refractive index is smaller than 0.1,
   wherein the phosphor comprises a Mn(IV)-activated fluoride compound,
   wherein the Mn(IV)-activated fluoride compound comprises $Na_3Li_3Al_2F_{12}$:Mn(IV).

2. A lighting device according to claim 1, wherein the polymer is a fluorine-containing polymer.

3. A lighting device according to claim 2, wherein the polymer is a co-polymer comprising at least two of tetrafluoroethylene, hexafluoropropylene and vinylidene fluoride.

4. A lighting device according to claim 3, wherein the polymer is a co-polymer of tetrafluoroethylene, hexafluoropropylene and vinylidene fluoride.

5. A lighting device according to claim 1, wherein the amount of phosphor in the polymer ranges from 10-20 vol. %.

6. A lighting device according to claim 1, wherein the device comprises at least two light sources and wherein the wavelength converting element is arranged remotely from the light sources.

7. A wavelength converting element according to claim 1, wherein the element has the shape of an optical lens.

8. A wavelength converting element according to claim 1, wherein the element has the shape of an optical plate.

9. A lighting device according claim 1, wherein the polymer is a fluorine-containing polymer.

10. A lighting device according to claim 9, wherein the polymer is a co-polymer comprising at least two of tetrafluoroethylene, hexafluoropropylene and vinylidene fluoride.

11. A lighting device according to claim 10 further comprising a wavelength converting element.

12. A lighting device comprising:
    a light source arranged to emit light with a primary wavelength, and
    a wavelength converting element arranged to convert at least part of the light with the primary wavelength into light with a secondary wavelength, the element comprising a phosphor with a metal-ion activator which is excitable via a partially forbidden electronic transition, said phosphor being compounded with a polymer, the phosphor and the polymer being chosen such that the difference in their refractive index is smaller than 0.1,
    wherein the phosphor comprises a Mn(IV)-activated fluoride compound,
    wherein the polymer is a fluorine-containing polymer,
    wherein the polymer is a co-polymer comprising at least two of tetrafluoroethylene, hexafluoropropylene and vinylidene fluoride.

13. A lighting device according to claim 12 further comprising a wavelength converting element.

* * * * *